(12) United States Patent
Nagata

(10) Patent No.: US 6,556,601 B2
(45) Date of Patent: Apr. 29, 2003

(54) METHOD FOR COMPENSATING FOR OUTPUT OF SEMICONDUCTOR LUMINOUS DEVICE AND APPARATUS THEREFOR

(75) Inventor: Shin Nagata, Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/896,605

(22) Filed: Jun. 29, 2001

(65) Prior Publication Data

US 2002/0006142 A1 Jan. 17, 2002

(30) Foreign Application Priority Data

Jun. 30, 2000 (JP) ........................................ 2000-198964

(51) Int. Cl.$^7$ ............................................... H01S 3/10
(52) U.S. Cl. ........................ 372/29.011; 372/29.014; 372/29.021; 372/31
(58) Field of Search ................... 372/32, 34, 29.01, 372/29.011, 29.014, 29.021, 29.015, 31

(56) References Cited

U.S. PATENT DOCUMENTS

| | | | |
|---|---|---|---|
| 5,163,063 A | * | 11/1992 | Yoshikawa et al. ........... 372/38 |
| 5,347,384 A | | 9/1994 | McReynolds et al. |
| 5,487,120 A | | 1/1996 | Choy et al. |
| 5,517,489 A | | 5/1996 | Ogura |
| 5,825,949 A | | 10/1998 | Choy et al. |

* cited by examiner

Primary Examiner—James Davie
(74) Attorney, Agent, or Firm—Rankin, Hill, Porter & Clark LLP

(57) ABSTRACT

A variation in optical output of a semiconductor luminous device outputting an optical signal to an optical fiber which is caused due to a variation in ambient temperature and an end of a life thereof capable of being compensated for without measuring the optical output. An output variation quantity H0(Ta) of the semiconductor luminous device due to the ambient temperature Ta is operated in a step S2. In a step S4, an output reduction quantity ST of the semiconductor luminous device obtaining by accumulating an output reduction ST thereof per unit time due to a deterioration of the device is provided. In a step S5, it is judged that a life of the device reaches an end when the output reduction ST exceeds a reference value ST0. When the former fails to exceed the latter, a variation quantity IH(Ta) of a drive current command value due to the ambient temperature Ta and a current reduction quantity IST(ST, dST) determined due to a deterioration of the device are operated in a step S6. A drive current Id for driving the semiconductor luminous device is determined on the basis of a sum Is of the current command value Ic, the current variation quantity and the current reduction quantity. An output of the device is compensated for by repeating steps S1 to S9.

10 Claims, 2 Drawing Sheets

METHOD FOR COMPENSATING FOR OUTPUT OF SEMICONDUCTOR LUMINOUS DEVICE AND APPARATUS THEREFOR

BACKGROUND OF THE INVENTION

This invention relates to a method for compensating for an output of a semiconductor luminous device and an apparatus therefor, and more particularly to a method for compensating for a variation in optical output of a semiconductor luminous device for outputting an optical signal to an optical fiber due to both a variation in ambient temperature and a change of the semiconductor luminous device with time.

An output of a semiconductor luminous device for outputting an optical signal to an optical fiber is varied due to a variation in ambient temperature and a deterioration of the device due to an increase in ambient temperature and with time. A variation of output of the semiconductor due to a variation in ambient temperature has been conventionally subjected to compensation. However, the prior art fails to compensate for a deterioration in output of the device due to a variation in ambient temperature and with time.

Thus, the prior art fails to satisfactorily compensate for a reduction in luminous output of the semiconductor luminous device.

SUMMARY OF THE INVENTION

The present invention has been made in view of the foregoing disadvantage of the prior art.

It is an object of the present invention to provide a method for compensating for an output of a semiconductor luminous device which is capable of facilitating temperature compensation for the semiconductor luminous device and deterioration compensation therefor.

It is another object of the present invention to provide a method for compensating for an output of a semiconductor luminous device which is capable of raising an alarm indicating that a life of the semiconductor luminous device is nearing an end.

It is a further object of the present invention to provide a method for compensating for an output of a semiconductor luminous device which is capable of effectively preventing breakage of the semiconductor luminous device by both temperature compensation for the semiconductor luminous device and deterioration compensation therefor.

It is still another object of the present invention to provide an apparatus for compensating for an output of a semiconductor luminous device which is capable of facilitating temperature compensation for the semiconductor luminous device and deterioration compensation therefor.

It is yet another object of the present invention to provide an apparatus for compensating for an output of a semiconductor luminous device which is capable of raising an alarm indicating that a life of the semiconductor luminous device is nearing an end.

It is a still further object of the present invention to provide an apparatus for compensating for an output of a semiconductor luminous device which is capable of effectively preventing breakage of the semiconductor luminous device by both temperature compensation for the semiconductor luminous device and deterioration compensation therefor.

In accordance with one aspect of the present invention, there is provided a method for compensating for an output of a semiconductor luminous device for outputting an optical signal to an optical fiber wherein an output variation quantity of the semiconductor luminous device due to a variation in ambient temperature is provided, to thereby adjust a drive current of the semiconductor luminous device, resulting in being compensated for. The method includes the steps of operating an output reduction of the semiconductor luminous device per unit time owing to a deterioration of the semiconductor luminous device depending on a current fed to the semiconductor luminous device and the ambient temperature and obtaining an output reduction quantity of the semiconductor luminous device based on a life of the semiconductor luminous device using a cumulative value of the output reduction. The method also includes the step of adjusting the drive current on the basis of the output variation quantity and the output reduction quantity. Such construction permits compensation for both an output reduction of the semiconductor luminous device due to a deterioration in characteristics of the semiconductor luminous device and an output reduction thereof due to a temperature variation, to thereby ensure that the semiconductor luminous device may exhibit a constant performance over a long period of time.

In a preferred embodiment of the present invention, the method further includes the step of comparing the output reduction quantity with a reference value predetermined depending on the semiconductor luminous device, to thereby make judgment that a life of the semiconductor luminous device is nearing an end, resulting in raising an alarm when the output reduction quantity exceeds the reference value. Such a step permits the fact that the semiconductor luminous device is nearing an end of a life thereof to be effectively indicated, so that the semiconductor luminous device may be safely replaced with a new one.

In a preferred embodiment of the present invention, the method may further include the steps of operating an added value obtained by addition between the output variation quantity and the output reduction quantity and restricting the added value so that the drive current of the semiconductor luminous device determined depending on a current command value for commanding the drive current and the added value may be at a level of a rated feed current of the semiconductor luminous device or below. Also, the method may further include the step of raising an alarm when a duration during which the drive current is kept at the predetermined constant level reaches or exceeds a predetermined period of time. Such construction effectively prevents flowing of a large current (or a current larger than the rated feed current) through the semiconductor luminous device which promotes a deterioration of the semiconductor luminous device.

In accordance with another aspect of the present invention, there is provided an output compensation apparatus for a semiconductor luminous device for outputting an optical signal to an optical fiber, which generally includes a semiconductor drive circuit for feeding the semiconductor luminous device with a drive current on the basis of a current command value, a temperature sensor for detecting an ambient temperature of the semiconductor luminous device, a temperature compensation means for providing an output variation quantity of the semiconductor luminous device depending on a variation in the ambient temperature using an output of the temperature sensor, an addition point for adding a compensation quantity based on the output variation quantity to the current command value to provide an added value and feedback it to the semiconductor drive circuit. The output compensation apparatus is featured in that it includes a life-based reduction operation means for operating an output reduction of the semiconductor luminous device per unit time owing to a deterioration of the semiconductor luminous device depending on a current fed to the semiconductor luminous device and the ambient temperature to provide an output reduction quantity of the semiconductor luminous device based on a life thereof using a cumulative value of the output reduction, and an addition means for adding the output variation quantity and the output reduction quantity to each other to provide the compensation quantity. Use of the compensation quantity thus obtained permits the apparatus to compensate for an output reduction of the semiconductor luminous device due to a variation in ambient temperature and a deterioration in characteristics of the semiconductor luminous device while being significantly reduced in manufacturing cost thereof.

In a preferred embodiment of the present invention, the life-based reduction operation means includes an output reduction operation means for operating an output reduction of the semiconductor luminous device per unit time owing to a deterioration of the semiconductor luminous device depending on the current command value fed to the current drive circuit and an output of the temperature sensor, as well as an output reduction quantity operation means for accumulating an output of the output reduction operation means to provide the output reduction quantity. Such configuration likewise permits the output compensation apparatus to compensate for an output reduction of the semiconductor luminous device due to a variation in ambient temperature and a deterioration of the semiconductor luminous device while being significantly reduced in manufacturing cost thereof.

In a preferred embodiment of the present invention, the output compensation apparatus also includes a life judging means for comparing the output reduction quantity with a reference value predetermined depending on the semiconductor luminous device, to thereby make judgment that a life of the semiconductor luminous device is nearing an end, resulting in raising an alarm when the output reduction quantity exceeds the reference value. Such construction permits the output compensation apparatus to positively inform in an early stage that a life of the semiconductor luminous device is nearing an end due to the ambient temperature and a deterioration of the semiconductor luminous device while being significantly reduced in manufacturing cost thereof.

In a preferred embodiment of the present invention, the output compensation apparatus also includes a limiter for subjecting an added value obtained by addition between the output variation quantity and the output reduction quantity to restriction so that the drive current of the semiconductor luminous device determined depending on a current command value for commanding the drive current and the added value exceeds a level of a rated feed current of the semiconductor luminous device. The limiter may be constructed so as to raise an alarm when a duration during which the drive current is kept at the predetermined constant level reaches or exceeds a predetermined period of time. Such configuration minimizes a reduction in life of the semiconductor luminous device due to an excessive increase in drive current for compensating for an output reduction of the semiconductor luminous device due to the ambient atmosphere and a deterioration of the device while significantly reducing a manufacturing cost of the device.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENT

Now, the present invention will be described with reference to the accompanying drawings.

Figure 1:
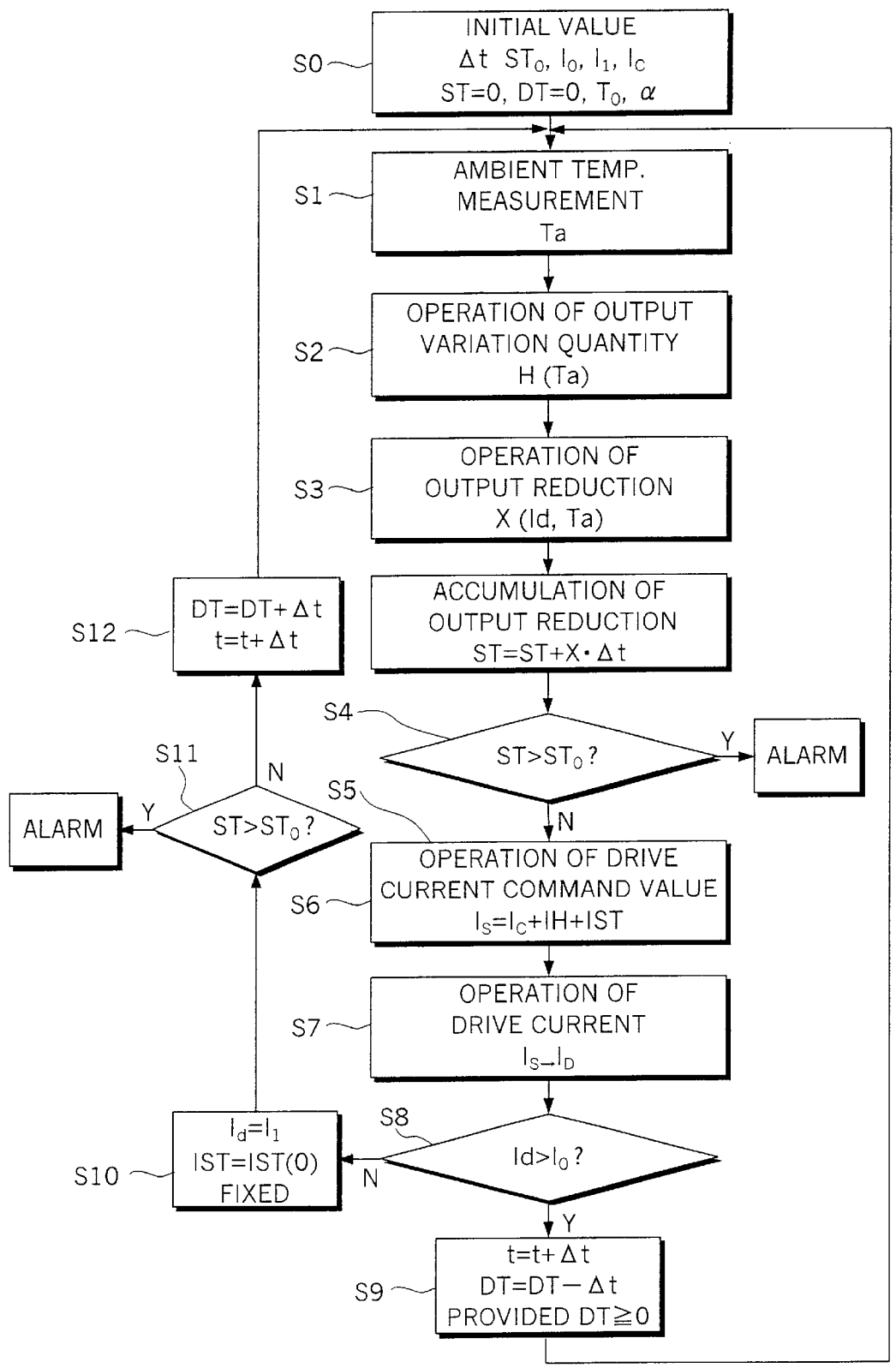
FIG. 1 is a flow chart showing an algorithm of a concept of an embodiment of a method for compensating for an output of a semiconductor luminous device according to the present invention.
Figure 2:
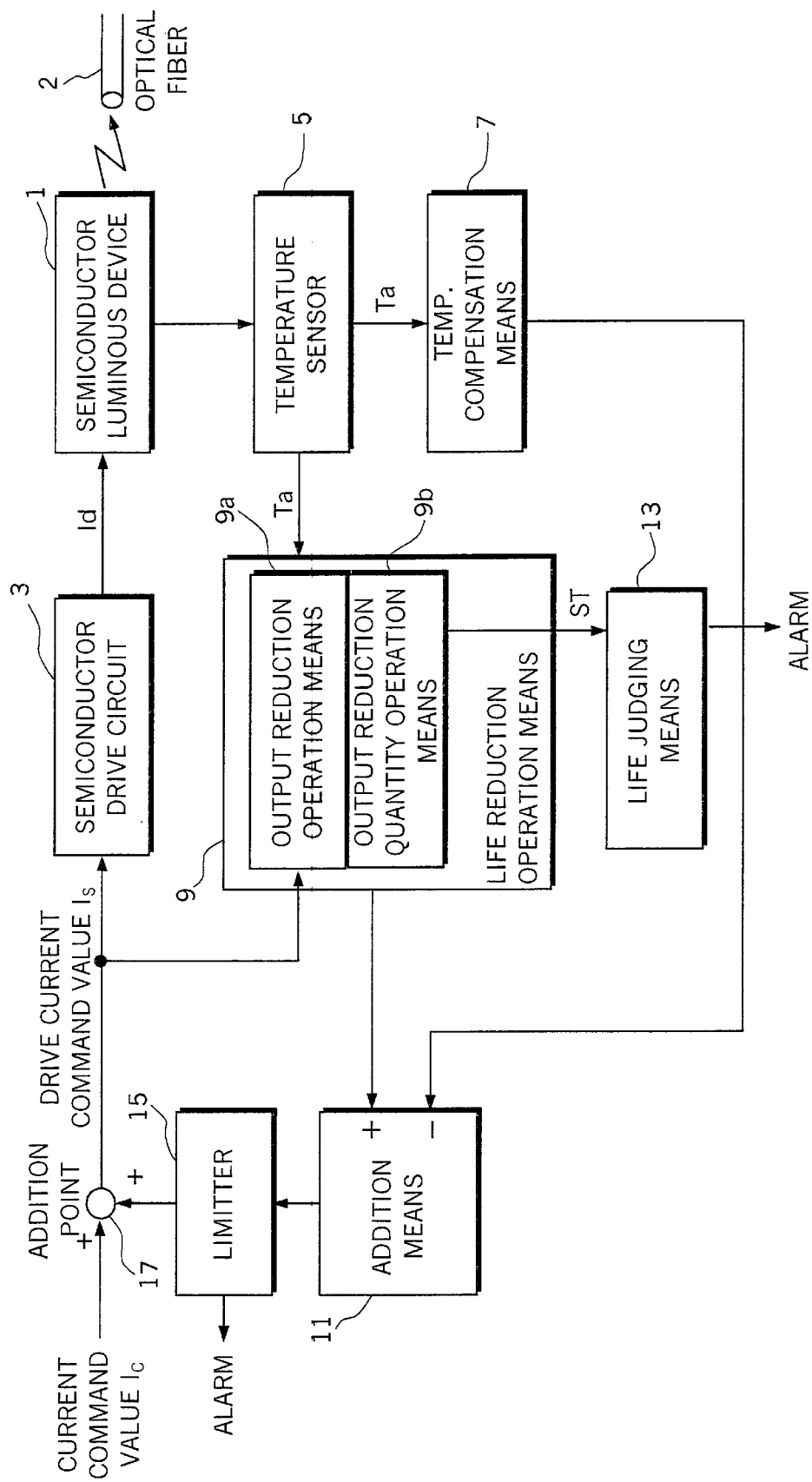
FIG. 2 is a block diagram showing an embodiment of a method for compensating for an output of a semiconductor luminous device according to the present invention.

Referring to FIGS. 1 and 2, an embodiment of a method for compensating for an output of a semiconductor luminous device according to the present invention is explained. A semiconductor luminous device designated at reference numeral 1 outputs an optical signal to an optical fiber 2. A variation in ambient temperature Ta with respect to the semiconductor luminous device leads to a variation in luminous intensity of the optical signal. Also, a deterioration of the semiconductor luminous device 1 causes a reduction in luminous intensity of the signal. Thus, in order to keep an output of the semiconductor luminous device constant, it is required to compensate for a variation in luminous intensity due to a variation in ambient temperature Ta and a reduction in luminous intensity due to a deterioration of the semiconductor luminous device. Such compensation for the intensity is carried out according to an expression (4) in a step S6 in a flow chart of FIG. 1 described below. Steps described hereinafter each indicate each of steps in the flow chart of FIG. 1.

Reference numeral 3 in FIG. 2 designates a semiconductor drive circuit, which functions to feed the semiconductor luminous device 1 with a drive current on the basis of a drive current command value Is given by the expression (4) in the step S6. The drive current command value Is is given by the expression (4) in the step S6 using both a current IH(Ta) of which the amount of variation is compensated for (herein referred to as "output variation compensation current IH(Ta)") based on the amount H(Ta) of variation of an output (herein referred to as "output variation quantity H(Ta)") of the semiconductor luminous device depending on the ambient temperature Ta and a current IST(ST, X) for compensating for the amount of reduction in output (herein referred to as "output reduction compensation current IST (ST, X)") of the semiconductor luminous device on the basis of the amount ST of reduction of an output (herein referred to as "output reduction quantity ST" and "output reduction per unit time X") of the semiconductor luminous device due to a deterioration of the semiconductor luminous device. The output variation quantity H(Ta) is given by an expression (1) in a step S2. The output variation compensation current IH(Ta) is given by an expression (5) in the step S6. Also, the output reduction compensation current IST(ST, X) is given by an expression (6) in the step S6.

Reference numeral 5 designates a temperature sensor, which acts to detect the ambient temperature Ta of the semiconductor luminous device 1 in a step 1. This results in the ambient temperature Ta being measured momently.

The ambient temperature Ta outputted from the temperature sensor 5 is fed to a temperature compensation means 7, which functions to obtain, on the basis of the ambient temperature Ta, the above-described output variation quantity H(Ta) of the semiconductor luminous device 1 depending on a variation in ambient temperature Ta in the step S2.

Reference numerals 9 indicates a life-based reduction operation means 9 for operating the amount of reduction in life of the semiconductor luminous device 1. More particularly, the life-based reduction operation means 9 functions to operate a reduction in output or output reduction X(Ta, Id) of the semiconductor luminous device 1 per unit time owing to a deterioration of the semiconductor luminous device 1 depending on a current Id fed to the semiconductor luminous device 1 and the ambient temperature Ta according to an expression (2) in a step S3. Also, it calculates a cumulative value of an output reduction of the semiconductor luminous device 1 due to a deterioration of the semiconductor luminous device 1 according to an expression (3) in a step S4, to thereby provide the above-described output reduction quantity ST of the semiconductor luminous device depending on a life of the semiconductor luminous device 1.

Reference character 9a is an output reduction operation means, which functions to operate the output reduction X(Ta, Id) of the semiconductor luminous device 1 per unit time due to a deterioration of the semiconductor luminous device depending on the drive current Id fed to the semiconductor luminous device 1 from the semiconductor drive circuit 3 and the ambient temperature Ta measured by the temperature sensor 5 according to the expression (2) in the step S3.

Reference character 9b is an output reduction quantity operation means, which functions to accumulate the output reduction X(Ta, Id) which is an output of the output reduction operation means 9a with an initial value ST=0 at time intervals of Δt according to the expression (3) in the step S4, to thereby provide the output reduction quantity ST of the semiconductor luminous device on the basis of a deterioration of the semiconductor luminous device 1.

Reference numeral 13 is a life judging means 13, which acts to compare the output reduction quantity ST of the semiconductor luminous device 1 due to a deterioration thereof which has been operated by the output reduction quantity operation means 9b with a reference value ST0 predetermined depending on characteristics of the semiconductor luminous device 1 in a step S5. As a result, when the output reduction quantity ST exceeds the reference value ST0, the life judging means 13 makes judgment that a life of the semiconductor luminous device 1 is nearing an end, to thereby raise an alarm in the step S5.

Reference numeral 11 designates an addition means for adding a compensation value of the output variation compensation current IH(Ta) given by the expression (5) in the step S6 for compensating for a variation in output of the semiconductor luminous device 1 due to a variation in ambient temperature Ta operated by the temperature compensation means 7 and the output reduction compensation current IST(Ta, Is) given by the expression (6) in the step S6 for compensating for the output reduction quantity of the semiconductor luminous device 1 due to a deterioration thereof operated by the life-based reduction operation means 9 to each other.

Reference numeral 17 designates an addition point or summing point, in which a current command value Ic and an added value Is obtained by addition between a compensation value of the output variation compensation current IH(Ta) and the output reduction compensation current IST(Ta, Is) which are operated in the addition means 11 are added to each other according to the expression (4) in the step S6. A result of the addition is feedbacked to the semiconductor drive circuit 3 in the form of a drive current command value in which a variation in output of the semiconductor luminous device due to a variation in ambient temperature Ta and a deterioration of the semiconductor luminous device 1 is compensated for. The semiconductor drive circuit 3 operates the drive current Id on the basis of the thus-feedbacked drive current command value in a step S7.

Reference numeral 15 designates a limiter, which is constructed so as to judge in a step S8 whether the drive current Id determined on the basis of the drive current command value Is for commanding the drive current Id of the semiconductor luminous device 1 which is given by the expression (4) in the step S6 is below a rated feed current I0 of the semiconductor luminous device 1. When the drive current Id is at the limited level or above, the limiter 15 adds restriction such as IST(ST, X)=IST(0) to the added value of the compensation current (given by the expression (6) in a step 10) corresponding to the output reduction quantity due to a deterioration of the semiconductor luminous at the drive current command value Is, to thereby fix the drive current command value Is so that the drive current Id is at a predetermined current level I1 lower than the rated feed current (Id=I1). A duration DT for which such a state is maintained is accumulated by an expression (8) in a step S12. Whether the duration DT is above TO is judged in a step S11. As a result, the limiter 15 continues its operation when the duration DT is equal to or below T0 to thereby raise an alarm when it is above TO. In the case that the duration DT is within T0, the duration DT is subtracted in a range of a positive value according to expressions (9) and (10) in a step S9 when the drive current returns to a level equal to or below the rated feed current I0.

The apparatus shown in FIG. 2 repeats the above-described function or procedure in a cycle at every time interval Δt according to the flow chart of FIG. 1.

Now, the flow chart of FIG. 1 will be described in detail. At an initial state S0, parameters given at an initial stage of the method of the present invention are as follows:

The time interval Δt is a minimum cycle time for executing the flow chart of the present invention. A cycle of output compensation of the semiconductor luminous device 1 is repeated at every time interval Δt. A deterioration of the semiconductor luminous device 1 slowly occurs as compared with a change in ambient temperature, so that a length of cycle time of the output compensation is set to be as long as a minimum time length for which a daily temperature change occurs. For example, it may be set to be as long as several minutes at a minimum. Of course, a certain latitude may be allowed in the length. Alternatively, the length may be varied within a certain range sufficient to render a width of variation of the temperature constant. The reference value ST0 for permitting an alarm to be raised in the case of judgment of "a life of the semiconductor luminous device being nearing an end" which is made when the output reduction quantity of the semiconductor luminous device 1 due to a deterioration thereof reaches the predetermined level is given. Also, the rated feed current for giving a maximum current fed to the semiconductor luminous device 1 and the predetermined current level I1 lower than the rated feed current I0 are given. In addition, the predetermined duration T0 which permits an alarm to be raised due to judgment "abnormality of the system occurs" which is made when a state that the drive current reaches the rated current of the semiconductor luminous device is maintained is given. Further, a parameter α (for example, $0 \leq \alpha \leq 1$) used after the drive current returns to a level equal to or below the rated current and the current command value Ic for commanding the semiconductor drive current are given. Supposing that an initial value of the output reduction quantity ST depending on an output life of the semiconductor luminous device 1 is 0 (ST=0) and an initial value of the duration DT during which a state that the drive current reaches the rated feed current I0 is maintained is 0 (DT=0), the flow chart of FIG. 1 is executed as follows:

In the step S1, the ambient temperature Ta of the semiconductor luminous device 1 for outputting an optical signal to the optical fiber is measured.

In the step S2, the output variation quantity H(Ta) due to a variation in ambient temperature Ta is operated. The output variation quantity H(Ta) depending on the ambient temperature Ta may be expressed as a function of the ambient temperature Ta according to the following expression (1):

$$H(Ta)=a \cdot \exp(b \cdot Ta+c) \quad (1)$$

wherein a, b and c each are a constant independent from both time and a temperature.

In the step S3, the output reduction X(Id, Ta) of the semiconductor luminous device 1 per unit time owing to a deterioration of the semiconductor luminous device depending on the current Id fed to the semiconductor luminous device 1 and the ambient temperature Ta is operated. The output reduction is given by the following expression (2):

$$X(Id, Ta)=k \cdot \exp(m \cdot Is) \cdot \exp(n/Ta) \quad (2)$$

wherein k, m and n each are a constant independent from time, the ambient temperature Ta and the drive current command value Is. In the illustrated embodiment, the output reduction X(Id, Ta) is not a function of the current Id fed to the semiconductor luminous device 1 but a function of the drive current command value Is for driving the semiconductor luminous device 1. Relationship in which the current Id flowing through the semiconductor luminous device is a function of the drive current command value Is is substituted in the expression. Also, the expression contains an effect of a time variation of the drive current command value Is and ambient temperature Ta.

In the step S4, the output reduction quantity ST of the semiconductor luminous device 1 obtained by accumulating the output reduction X(Id, Ta)·Δt of the semiconductor luminous device per time interval Δt owing to a deterioration of the semiconductor luminous device is started at the initial condition ST=0 and obtained according to the following recurrence expression (3):

$$ST=ST+X(Id, Ta) \cdot \Delta t \quad (3)$$

In the step S5, judgment that a life of the semiconductor luminous device is nearing an end is made, resulting in an alarm being raised when the output reduction quantity ST of the semiconductor luminous device exceeds the reference value ST0 determined at the initial state or when relationship ST>ST0 is established. At this time, the procedure is stopped for substituting a new semiconductor luminous device for the semiconductor luminous device reduced in life.

In the step S6, the output variation compensation current IH(Ta) for compensating for the drive current command value based on the output variation quantity H(Ta) of the semiconductor luminous device depending on the ambient temperature is operated when the output reduction quantity ST of the semiconductor luminous device does not exceed the reference value ST0. Also, the output reduction compensation current IST(ST, X) for compensating for the output reduction of the semiconductor luminous device due to a deterioration thereof is operated. The output reduction compensation current IST(ST, X) is a function of the output reduction X due to a deterioration of the semiconductor luminous device and the output reduction quantity ST obtained by accumulating the output reduction X. The thus-operated output variation compensation current IH(Ta) and output reduction compensation current IST(ST, X) are used for determining the compensated drive current command value Is for driving the semiconductor drive circuit 3 according to the following expression (4):

$$IS=Ic+IH(Ta)+IST (ST, X) \quad (4)$$

wherein IH(Ta) and IST(ST, X) are defined as follows:

$$IH(Ta)=\kappa[H(Ta)]^p \quad (5)$$

$$IST(ST, X)=\lambda(ST)^q X^r \quad (6)$$

wherein κ, λ, p and q each are a constant independent from both a temperature and time.

In the step S7, the drive current Id for driving the semiconductor luminous device is operated on the basis of the drive current command value Is. This results in a compensation value for the drive current Id being determined, so that an output of the semiconductor luminous device may be kept at a fixed or constant value by means of the drive current Id thus compensated for. Also, the drive current command value Is used at this time is also used for operation of X in the expression (2) in the next cycle.

In the step S8, whether the drive current Id is smaller than the rated feed current I0 or relationship Id<I0 is established is judged.

In the step S9, when the drive current Id is smaller than the rated feed current, it is ensured that the semiconductor luminous device is normally operated, to thereby continue to be operated as it is.

The time advances according to the following expression (7):

$$t=t+\Delta t \quad (7)$$

and the procedure is returned to the step S1. In the step S8, when the drive current Id exceeds the rated feed current I0, the step S10 is executed.

In the step S10, when the drive current Id is larger than the rated feed current I0, the added value obtained by addition between the output variation quantity and the output reduction quantity is subjected to restriction. The output reduction compensation current IST(ST, X) is fixed at a constant value IST(0) so that the drive current Id may be rendered equal to I1 (Id=I1) by means of the drive current command value Is obtained according to the expression (4) described above.

In the step S11, whether a cumulative time DT of a duration during which the drive current Id is maintained at a level of the rated feed current I0 is above a predetermined limit time T0 is judged. When the former fails to exceed the latter, the procedure is advanced to the step S12.

In the step S12, accumulation of the cumulative time DT is carried out according to the following expression (8):

$$DT=DT+\Delta t \quad (8)$$

Also, the time t is recorded according to the above-described expression (7) and the procedure is returned to the step S1. In the step S8, when the drive current Id exceeds the rated feed current I0 again, the drive current Id and output reduction compensation current IST(ST, X) are kept equal to I1 and IST(0) (Id=I1 and IST(ST, X)=IST(0)) in the step S10, respectively, and the procedure is advanced to the step S11. When the drive current Id is kept exceeding the rated feed current I0 and the cumulative time DT is kept larger than T0 (DT<0) in the step S11, a loop extending from the step S1 to the step S8, from the step S10 to the step S12, and then to the step S1 is repeated. When the drive current Id is returned to a level lower than that of the rated feed current I0 during DT<T0 in the step S8, the present procedure may be maintained. In the step S9, the time advances according to the expression (7) and the cumulative time DT is subtracted according to the following expression (9):

$$DT = DT - \alpha \Delta t \tag{9}$$

wherein $0 \leq \alpha \leq 1$. In this instance, when a result of the operation according to the expression (9) indicates DT<0, relationship indicated by the following expression (10) is set up:

$$DT = 0 \tag{10}$$

and the procedure is returned to the step S1. When the drive current Id of the semiconductor luminous device is kept equal to or above the rated feed current I0 in the step S8 and the cumulative time DT is judged to exceed the limit time T0 in the step S11, an alarm indicating that abnormality occurs in the system is raised. The procedure is controlled by the system. In this instance, the procedure may be stopped as required.

In the illustrated embodiment, the expressions (1) and (2) and expressions (5) and (6) described above each are indicated by way of example, thus, the present invention may be of course applied to any other experimental formula.

As can be seen from the foregoing, the present invention effectively compensates for an output variation of the semiconductor luminous device due to a variation in ambient temperature and an output reduction thereof owing to a deterioration of the semiconductor luminous device due to a current fed thereto and the ambient temperature without directly measuring a luminous output of the semiconductor luminous device. Also, the present invention permits the fact that a life of the semiconductor luminous device is nearing an end due to a deterioration thereof to be positively informed in an early stage. Further, the present invention permits occurrence of any abnormal operation to be effectively informed in an early stage.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method for compensating for an output of a semiconductor luminous device for outputting an optical signal to an optical fiber wherein an output variation quantity of the semiconductor luminous device due to a variation in ambient temperature is provided, to thereby adjust a drive current of the semiconductor luminous device, comprising the steps of:

obtaining an output reduction by computation of the semiconductor luminous device per unit time owing to a deterioration of the semiconductor luminous device depending on a current fed to the semiconductor luminous device and the ambient temperature, obtaining an output reduction quantity of the semiconductor luminous device based on a life of the semiconductor luminous device using a cumulative value of the output reduction; and adjusting the drive current on the basis of the output variation quantity and the output reduction quantity.

2. A method as defined in claim 1, further comprising the step of comparing said output reduction quantity with a reference value predetermined depending on the semiconductor luminous device, to thereby make judgment that a life of the semiconductor luminous device is nearing an end, resulting in raising an alarm when the output reduction quantity exceeds the reference value.

3. A method as defined in claim 1, further comprising the steps of operating an added value obtained by addition between the output variation quantity and the output reduction quantity, and restricting the added value so that the drive current of the semiconductor luminous device determined depending on a current command value for commanding the drive current and the added value may be at a level of a rated feed current of the semiconductor luminous device or below.

4. A method as defined in claim 3, further comprising the step of keeping the drive current of the semiconductor luminous device at a predetermined constant level equal to or below the level of the rated feed current of the semiconductor luminous device when the drive current determined depending on the current command value for commanding the drive current of the semiconductor luminous device and the added value exceeds the level of a rated feed current of the semiconductor luminous device and raising an alarm when a duration during which the drive current is kept at the predetermined constant level reaches or exceeds a predetermined period of time.

5. An output compensation apparatus for a semiconductor luminous device for outputting an optical signal to an optical fiber, comprising:

a semiconductor drive circuit for feeding said semiconductor luminous device with a drive current on the basis of a current command value;

a temperature sensor for detecting an ambient temperature of said semiconductor luminous device;

a temperature compensation means for providing an output variation quantity of said semiconductor luminous device depending on a variation in said ambient temperature using an output of said temperature sensor;

an addition point for adding a compensation quantity based on said output variation quantity to said current command value to provide an added value and feedback it to said semiconductor drive circuit;

a life-based reduction operation means for obtaining an output reduction by computation of said semiconductor luminous device per unit time owing to a deterioration of said semiconductor luminous device depending on a current fed to said semiconductor luminous device and said ambient temperature to provide an output reduction quantity of said semiconductor luminous device based on a life thereof using a cumulative value of said output reduction; and an addition means for adding said output variation quantity and output reduction quantity to each other to provide said compensation quantity.

6. An output compensation apparatus as defined in claim 5, wherein said life-based reduction operation means includes an output reduction operation means for operating an output reduction of said semiconductor luminous device per unit time owing to a deterioration of said semiconductor luminous device depending on said current command value fed to said current drive circuit and an output of said temperature sensor and an output reduction quantity operation means for accumulating an output of said output reduction operation means to provide said output reduction quantity.

7. An output compensation apparatus as defined in claim 5, further comprising a life judging means for comparing said output reduction quantity with a reference value predetermined depending on the semiconductor luminous device, to thereby make judgment that a life of said semiconductor luminous device is nearing an end, resulting in raising an alarm when the output reduction quantity exceeds the reference value.

8. An output compensation apparatus as defined in claim 5, further comprising a limiter for subjecting an added value obtained by addition between said output variation quantity and said output reduction quantity to restriction so that said drive current of said semiconductor luminous device determined depending on a current command value for commanding the drive current and said added value may be at a level of a rated feed current of said semiconductor luminous device or below.

9. An output compensation apparatus as defined in claim 8, wherein said limiter keeps said drive current of said semiconductor luminous device at a predetermined constant level equal to or below said level of said rated feed current of said semiconductor luminous device when said drive current determined depending on the current command value for commanding the drive current of said semiconductor luminous device and an output of said addition point for operating said added value exceeds the level of the rated feed current of said semiconductor luminous device; and said limiter raises an alarm when a duration during which the drive current is kept at the predetermined constant level reaches or exceeds a predetermined period of time.

10. An output compensation apparatus as defined in claim 6, further comprising a life judging means for comparing said output reduction quantity with a reference value predetermined depending on the semiconductor luminous device, to thereby make judgment that a life of said semiconductor luminous device is nearing an end, resulting in raising an alarm when the output reduction quantity exceeds the reference value.

* * * * *